United States Patent
Yamamoto (10) Patent No.: US 8,922,099 B2
(45) Date of Patent: Dec. 30, 2014

(54) SURFACE-MOUNT PIEZOELECTRIC DEVICE

(75) Inventor: Naoyuki Yamamoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 240 days.

(21) Appl. No.: 13/356,043

(22) Filed: Jan. 23, 2012

(65) Prior Publication Data
US 2012/0200198 A1    Aug. 9, 2012

(30) Foreign Application Priority Data

Feb. 9, 2011    (JP) ................. 2011-025685

(51) Int. Cl.
*H01L 41/053* (2006.01)
*H03H 9/02* (2006.01)
*H03H 9/15* (2006.01)
*H01L 23/04* (2006.01)

(52) U.S. Cl.
CPC . *H03H 9/02* (2013.01); *H03H 9/15* (2013.01); *H01L 23/04* (2013.01)
USPC ............................. 310/348; 310/350; 310/365

(58) Field of Classification Search
CPC ............................ H01L 41/053; H03H 9/1021
USPC .................................................. 310/348, 365
See application file for complete search history.

(56) References Cited

U.S. PATENT DOCUMENTS

| | | | |
|---|---|---|---|
| 7,436,272 B2 | 10/2008 | Fujii et al. | |
| 7,791,421 B2 | 9/2010 | Yamashita | |
| 2002/0067840 A1* | 6/2002 | Kobayashi | 381/111 |
| 2003/0095678 A1* | 5/2003 | Hooley et al. | 381/353 |
| 2004/0135474 A1 | 7/2004 | Koyama et al. | |
| 2007/0176518 A1* | 8/2007 | Moriya | 310/348 |
| 2008/0122317 A1* | 5/2008 | Fazzio et al. | 310/328 |

(Continued)

FOREIGN PATENT DOCUMENTS

| | | |
|---|---|---|
| JP | 2000-013177 A | 1/2000 |
| JP | 2004064701 | 2/2004 |

(Continued)

OTHER PUBLICATIONS

Office Action for Corresponding Japanese Application No. 2011-025685 mailed Sep. 16, 2014.
Office Action for Corresponding Japanese Application No. 2013-259683 mailed Oct. 14, 2014.

*Primary Examiner* — Derek Rosenau
*Assistant Examiner* — Bryan Gordon
(74) *Attorney, Agent, or Firm* — Alix, Yale & Ristas, LLP (57) ABSTRACT

The present invention provides piezoelectric surface mount devices in which the area of the mounting terminals is reduced, leading to reduction of manufacturing cost. A piezoelectric device comprises a package base (120) including a bottom surface having a long edge and a short edge and a pair of mounting terminals formed on respective short edges of the package base. The pair of mounting terminals are separated by a predetermined longitudinal distance (X3) and are arranged as close as possible to the longitudinal center line of the package base. The predetermined distance is sufficient to prevent electrical short when mounting the piezoelectric device onto the printed substrate. The maximum width (Z2) of each mounting terminal measured in a direction parallel with the short edges of the package base is less than one half the width of the short edge (Z1).

11 Claims, 8 Drawing Sheets

(56) References Cited

U.S. PATENT DOCUMENTS

| | | |
|---|---|---|
| 2009/0102315 A1 | 4/2009 | Komada et al. |
| 2009/0174291 A1* | 7/2009 | Nagano et al. ............... 310/344 |
| 2010/0244630 A1 | 9/2010 | Wada |
| 2011/0114353 A1* | 5/2011 | Iizuka et al. ............... 174/50.5 |
| 2011/0216027 A1* | 9/2011 | Kim et al. ................... 345/173 |
| 2012/0140969 A1* | 6/2012 | Fujise et al. ............... 381/333 |

FOREIGN PATENT DOCUMENTS

| | | |
|---|---|---|
| JP | 2004-254251 A | 9/2004 |
| JP | 2005-108923 A | 4/2005 |
| JP | 2006-032645 A | 2/2006 |
| JP | 2007-294649 A | 11/2007 |
| JP | 2010-129564 A | 6/2010 |

* cited by examiner

SURFACE-MOUNT PIEZOELECTRIC DEVICE

CROSS-REFERENCE TO RELATED APPLICATION

This application claims priority to and the benefit of Japan Patent Application No. 2011-025685, filed on Feb. 9, 2011, in the Japan Patent Office, the disclosure of which is incorporated herein by reference in its entirety.

FIELD

The present invention relates to piezoelectric devices having a mounting terminal with reduced surface area.

DESCRIPTION OF THE RELATED ART

A conventional surface-mountable piezoelectric device comprises a piezoelectric vibrating piece that vibrates when electrically energized. Respective mounting terminals are formed on a bottom surface of surface-mountable piezoelectric devices, and the devices are mounted onto a printed substrate by bonding the mounting terminal and the printed substrate using solder. The hardened solder may crack when exposed under significant temperature change.

Conventionally, cracks formed on solder have been prevented by increasing the size (surface area) of the mounting terminals of the piezoelectric devices. For example, Japan Unexamined Patent Document No. 2004-64701 discloses a piezoelectric device, in which the bonding strength between a surface mount device and substrate is increased by increasing the area of the mounting terminal to one half of the area of the bottom surface of the quartz-crystal vibrating device.

However, according to Japan Unexamined Patent Document No. 2004-64701, in order to make the surface area of the mounting terminals relatively large, significant amounts of electrode forming materials are required to manufacture the mounting terminals. Since expensive materials such as gold are used in the manufacture of piezoelectric devices, increasing the size of the mounting terminals can be costly.

It is therefore the purpose of the present invention to provide piezoelectric devices in which the area of the mounting terminals is reduced, leading to a corresponding reduction of manufacturing cost and prevention of solder cracks.

SUMMARY

A first aspect of the present disclosure relates to a piezoelectric device mounted onto a printed substrate using solder. The piezoelectric device comprises a piezoelectric vibrating piece having a pair of excitation electrodes and a package base including a generally rectangular bottom surface having side edges parallel with a longitudinal centerline (hereafter "long edge"), end edges perpendicular to the side edges and bisected by the longitudinal center line (hereafter "short edge") and a pair of mounting terminals formed on the bottom surface of the package base adjacent to each short edge. The pair of mounting terminals is electrically connected to the pair of excitation electrodes and the piezoelectric device is mounted onto the printed substrate. The pair of mounting terminals is situated in a predetermined configuration as close as possible in the longitudinal direction while maintaining a separation between the terminals in a longitudinal direction to prevent electrical short when mounting the piezoelectric device onto the printed substrate. The maximum width of the mounting terminal measured parallel with the short edges of the package base is less than a half of the width of the short edge.

A second aspect of the present disclosure pertains to piezoelectric devices. In its second aspect, the predetermined distance between the mounting terminals in the first aspect is between 0.5 mm to 1.0 mm.

A third aspect of the present disclosure pertains to piezoelectric devices. In its third aspect, the pair of mounting terminals in the first aspect or second aspect is symmetrical to a straight line that passes through a centerline in the short edge and parallel to the long edge (bisecting the piezoelectric device and the mounting terminals).

A fourth aspect of the present disclosure pertains to piezoelectric devices. In its fourth aspect, the pair of mounting terminals in the first to third aspects, each of the mounting terminals comprising a respective first edge, which is an edge of the mounting terminal formed on the short edges of the bottom surface of the package base, and a respective second edge having different length than the first edge and parallel to the first edge; wherein the respective second edges of the pair of mounting terminals are separated by a predetermined distance, and the first edge or the second edge of the mounting terminals have a length equal to the maximum width of the mounting terminal, measured parallel with the short edges of the package base.

A fifth aspect of the present disclosure pertains to piezoelectric devices. In its fifth aspect, the mounting terminals of the fourth aspect have trapezoid profile.

A sixth aspect of the present disclosure pertains to piezoelectric devices. In its sixth aspect, the profiles of the mounting terminals in the fourth aspect have the shape of two rectangles arranged on the center line of the package base and in contact with each other. A first rectangle extends from a first edge at the short edge of the package base to a third edge longitudinally spaced from the first edge and parallel therewith. A second rectangle extends from a second edge longitudinally spaced from the third edge to a fourth edge overlapping with the third edge.

A seventh aspect of the present disclosure pertains to piezoelectric devices. In its seventh aspect, each of the pair of mounting terminals in the first to third aspects comprise a respective first edge, which is an edge of each mounting terminal formed at the short edge of the bottom surface of the package base, and a respective second edge that is parallel to the first edge; wherein the second edges of the pair mounting terminals are separated by a predetermined longitudinal distance, and the first edge or the second edge are shorter than the maximum width of the mounting terminals measured parallel with the short edges of the package base.

An eighth aspect of the present disclosure pertains to piezoelectric devices. In its eighth aspect, the pair of mounting terminals in the first to third aspects comprises respective first points, which are the closest points to the other mounting terminals, and respective second points and respective third points are formed on respective edge portions at the maximum width of the mounting terminals measured parallel with the short edges of the package base. Each point is connected to the other points by a straight line or curved line to define the shape of the mounting terminals. A straight line may connect the first point and the second point, and the first point and the third point. Alternatively, a curved line may connect the second point and the third point by passing through the first point in arch manner.

According to the present invention, the piezoelectric devices are provided, in which the area of the mounting

BRIEF DESCRIPTION OF THE DRAWINGS

FIG. 4A is a plan view of the bottom surface of an alternative package base 220a.

FIG. 5A is a plan view of the bottom surface of an alternative package base 320a.

FIG. 6A is a plan view of the bottom surface of an alternative package base 420a.

FIG. 7A is a plan view of the bottom surface of an alternative package base 520a.

FIG. 8A is a plan view of the bottom surface of an alternative package base 620a.

DETAILED DESCRIPTION

Various representative embodiments are described below with reference to the respective drawings. It will be understood that the scope of the disclosure is not limited to the described embodiments, unless otherwise stated.

First Embodiment

Configuration of the Piezoelectric Device 100

Figure 1:
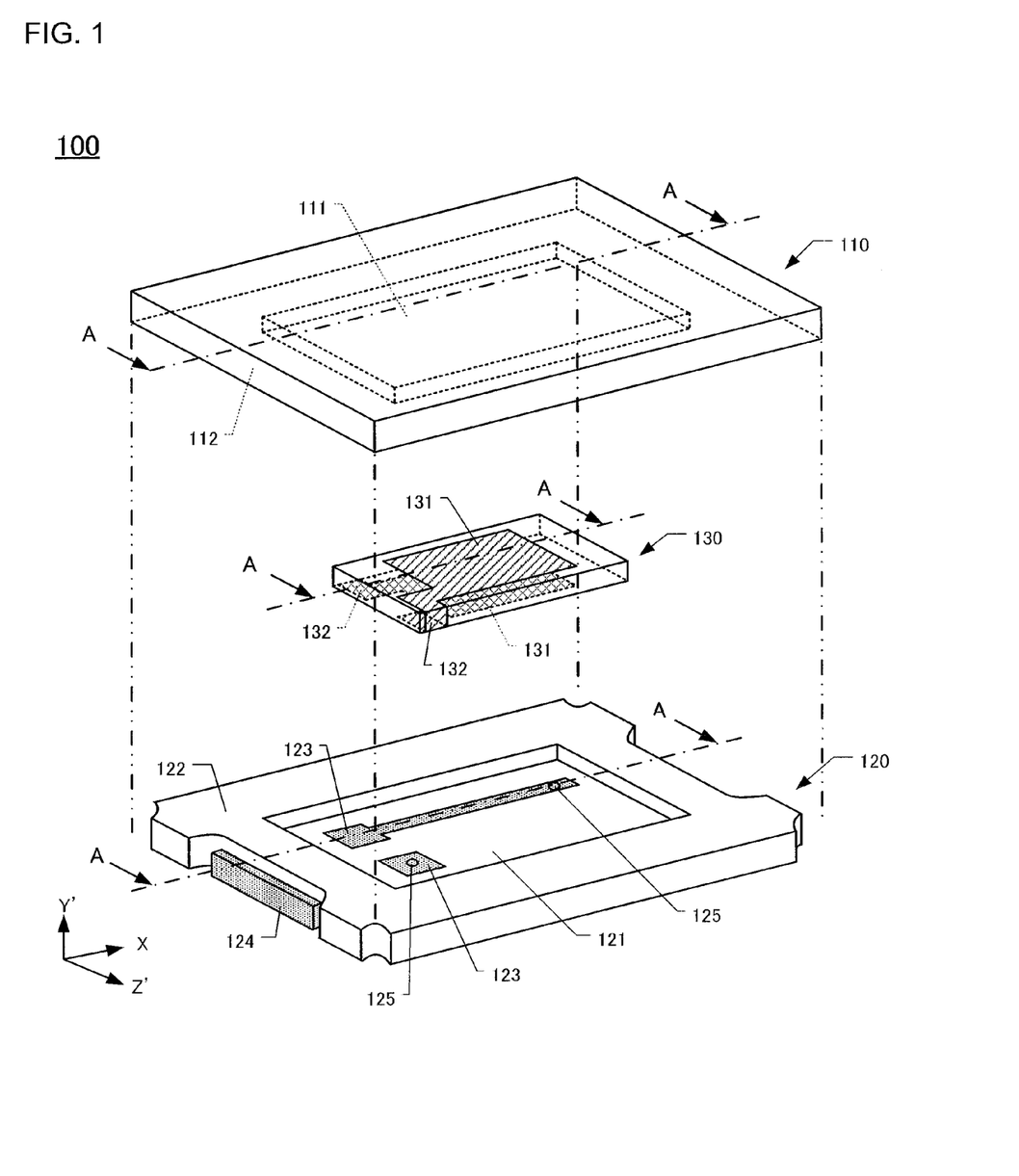
FIG. 1 is an exploded perspective view of a piezoelectric device 100.

FIG. 1 is an exploded perspective view of a piezoelectric device 100. The piezoelectric device 100 comprises a piezoelectric vibrating piece 130, a package lid 110 and a package base 120. The piezoelectric vibrating piece 130 is fabricated from an AT-cut quartz-crystal material, for example. An AT-cut quartz-crystal material has a principal surface (in the YZ plane) that is tilted by 35° 15' about the Y-axis of a crystal-coordinate system (XYZ) in the direction of the Y-axis from the Z-axis around the X-axis. Thus, in the following description, new axes tilted with respect to the axial directions of the quartz-crystal material are denoted as the Y'-axis and Z'-axis, respectively. Therefore, in the piezoelectric device 100, the longitudinal direction of the piezoelectric device is the X-axis direction, the height direction is the Y'-axis direction, and the direction that is perpendicular to the X-axis direction and Y'-axis direction is the Z'-axis direction.

In the piezoelectric device 100, the piezoelectric vibrating piece 130 is mounted on top of the +Y'-axis surface of the package base 120. The piezoelectric device 100 is formed by bonding together the package lid 110 and the package base 120 so as to hermetically seal the piezoelectric vibrating piece 130.

In the piezoelectric vibrating piece 130, the excitation electrodes 131 are situated on both principal surfaces (+Y'-axis and −Y'-axis surfaces). The extraction electrodes 132 are extracted from respective excitation electrodes 131 in the −X-axis direction. The extraction electrode 132 connected to the excitation electrode 131 formed on the −Y'-axis direction is extracted to the −Z'-axis edges on the −X-axis side of the −Y'-axis surface. Also, the extraction electrode 132 connected to the excitation electrode 131 formed on the +Y'-axis surface is extracted to the +Z'-axis edges on the −X-axis side of the −Y'-axis surface. The electrodes, such as the excitation electrodes 131 and extraction electrodes 132 formed on the piezoelectric vibrating piece 130 comprise a chromium layer (Cr) on the piezoelectric vibrating piece 130, followed by overlaying layer of gold (Au).

A recess portion 111 is situated on the −Y'-axis surface of the package lid 110. A bonding surface 112 is formed on the periphery of the recess portion 111. The package lid 110 is bonded to the package base 120 via the bonding surface 112.

A recess portion 121 is situated on the +Y'-axis surface of the package base 120. A bonding surface 122 is formed on the periphery of the recess portion 121. On the recess portion 121, a pair of connection electrodes 123 is formed that is electrically connected to the extraction electrode 132 of the piezoelectric vibrating piece 130. A pair of mounting terminals 124 is situated mainly on the −Y'-axis surface of the package base 120. The pair of connection electrodes 123 and the pair of mounting terminals 124 are electrically connected with each other via a through-hole electrode 125 (see FIG. 2A) that extends through the package base 120. The package base 120 is fabricated from, for example, ceramics. Also, the connection electrodes 123, mounting terminals 124 and through-hole electrodes 125 are fabricated from tungsten, for example, nickel is formed on top of tungsten as a foundation layer, and overlaying layer of gold is formed thereon.

Figure 2A:
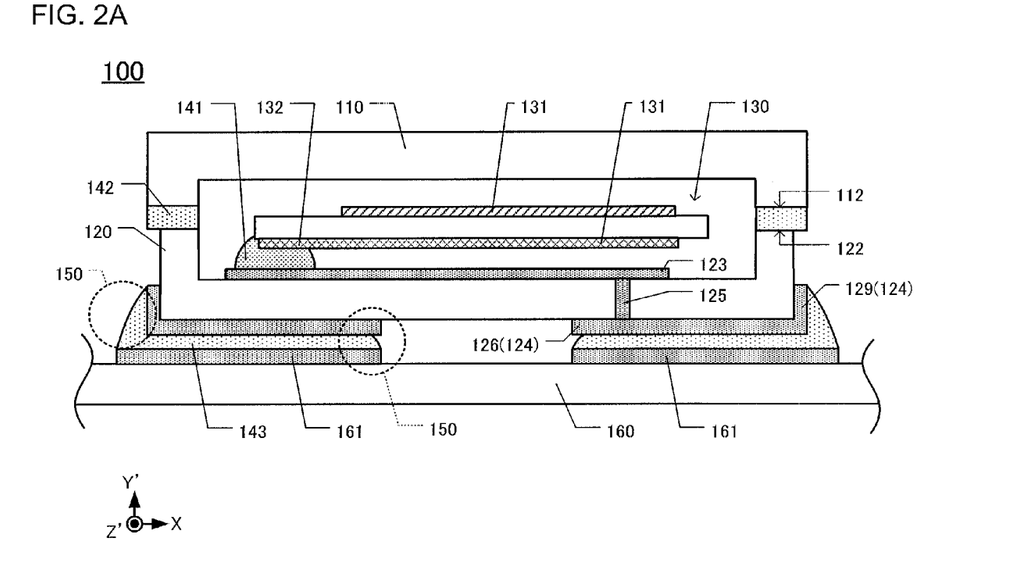
FIG. 2A is a cross-sectional view of the piezoelectric device 100 of FIG. 1 bonded to a printed substrate 160.

FIG. 2A is a cross-sectional view of the piezoelectric device 100 bonded to a printed substrate 160, such as a printed circuit (PC) board. The cross-sectional view of the piezoelectric device 100 in FIG. 2A is taken along A-A line. The piezoelectric vibrating piece 130 is bonded to the package base 120 using the electrically conductive adhesive 141. Also, the extraction electrodes 132 of the piezoelectric vibrating piece 130 are electrically connected to the connecting electrodes 123 situated on the package base 120 via the electrically conductive adhesive 141. The package lid 110 and package base 120 are bonded together using sealing material 142 formed between the bonding surface 112 and bonding surface 122. Respective printed substrate electrodes 161 are formed on a printed substrate 160. The piezoelectric device 100 is bonded to the printed substrate 160 by bonding together the mounting terminal 124 and the printed substrate 161 using solder 143. The mounting terminals 124 of the piezoelectric device 100 comprise respective bottom surface terminals 126, situated on the −Y'-axis surface of the package base 120, and respective side surface terminals 129 situated on both +X-axis and −X-axis surfaces of the package base 120. The formation of the solder 143 can be easily checked by forming respective side surface terminals 129, since the solder 143 is formed so as to cover the side surface terminals 129 formed on respective side surfaces of the package base 120.

Figure 2B:
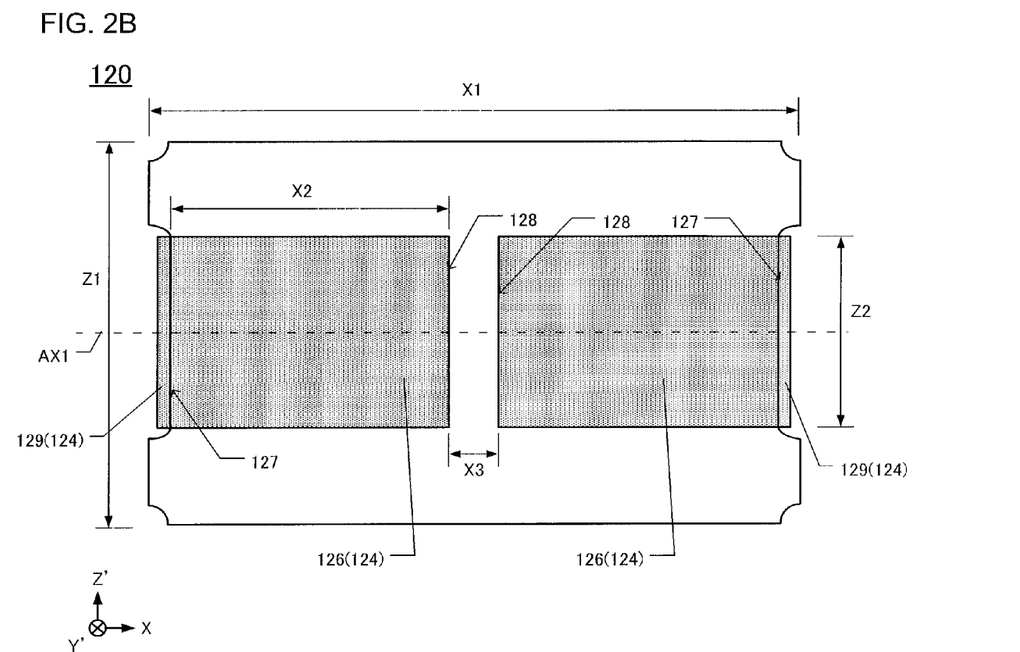
FIG. 2B is a plan view of the bottom surface of the package base 120 of the piezoelectric device of FIGS. 1 and 2.

FIG. 2B is a plan view of the package base 120, which is generally rectangular and has a length X1 and a width Z1. The long edges of the package base 120 extend in the X-axis direction and the short edges of the package base extend in the Z'-axis direction Therefore, if the longitudinal length of the package base 120 is denoted as X1, and the width is denoted as Z1, the length X1 is longer than the width Z1. The length X1 may be, for example, 8.0 mm and the width Z1 is 4.5 mm. The pair of mounting terminals 124 formed on the package base 120 is formed so as to align in the X-axis direction along a longitudinal center line AX1 of the package base 120. Each bottom surface terminal 126, which is the mounting terminal 124 on the bottom surface of the package base 120 has a rectangular profile having a long edge in the X-axis direction and a short edge in the Z'-axis direction. Whenever the maximum width of a bottom surface terminal 126 in the short edge direction is denoted as Z2, the maximum width in the long edge direction is denoted as X2 and the distance between two bottom surface terminals 126 is denoted as X3, the bottom surface terminals 126 of the package base 120 are situated so that the maximum dimensions are 3.575 mm in the long edge direction X2, 2.25 mm in the short edge direction Z2, and 0.6 mm X3 between a pair of bottom surface terminals 126. Also in the bottom surface terminals 126, the edge of the bottom surface terminal 126 adjacent the edge of the package base 120 in the longitudinal direction (the short edge of the package base) is denoted as the first edge 127 and the edge of the bottom surface terminal 126 parallel to and longitudinally spaced from the first edge 127 is denoted as the second edge 128. In this case, the two second edges 128 of the bottom surface terminals 126 are separated from each other by a distance X3. The width of the edge terminal 129 in the Z'-axis direction is the same width as the first edge 127. Further, the pair of mounting terminals 124 is formed symmetric to the longitudinal centerline AX1, which extends through the center of the short edges of the package base 120. Formation mounting terminals 124 symmetric to the centerline AX1 avoids tilting of the piezoelectric device 100 to the Z'-axis direction while mounting the piezoelectric device 100 onto a printed substrate 160. The term "symmetric" as used in the context of this application means that the longitudinal centerline AX1 of the package base 120 bisects the mounting terminals 124.

Thermo-Shock Cycle Test

Whenever abrupt change in temperature (thermal shock) occurs, the solder 143, which bonds the piezoelectric device 100 and the printed substrate 160, is stressed and can crack (including chips and cracks). This crack occurs between the +X-axis and −X-axis edges (dotted line 150 in FIG. 2) of the solder 143. When the crack extends through the solder in the X-axis direction, it can form an electrical disconnection between the mounting terminal 124 of the piezoelectric device 100 and the printed substrate electrode 161 of the printed substrate 160. The percentage of the solder crack refers to the percentage of the crack in the X-axis direction on the solder 143 over the total length of the solder 143 in the X-axis direction. As described below, an experiment was performed to determine the resistance of a piezoelectric device against thermal shock, by continuously applying heat shock, such as abrupt change in temperature, to the piezoelectric device mounted onto a printed circuit board.

In the thermal shock cycle test, the piezoelectric device mounted onto a printed substrate was kept under the −40 degrees (Celsius) for five minutes, and then kept above 125 degrees (Celsius) for five minutes. The cycle was repeated for several times to determine the percentage of solder crack. The thermal shock cycle test was done for three different types of piezoelectric devices having different maximum width Z2 of the mounting terminal 124 in the short edge direction. The printed substrate used for thermal-shock cycle test is glass epoxy substrate, and lead-free solder is used. Also the thickness of the solder when the piezoelectric device is mounted onto a printed substrate is 150 μm.

Figure 3A:
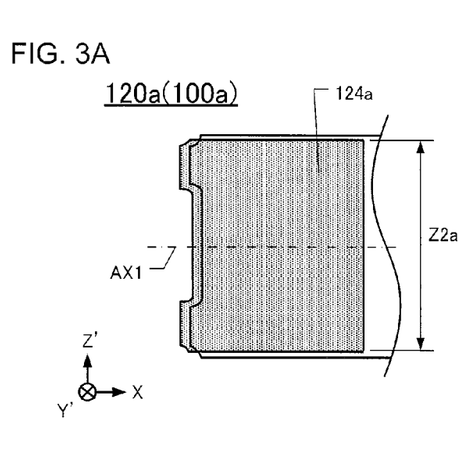
FIG. 3A is a plan view of a half of the bottom surface of an alternative package base 120a of the piezoelectric device 100a taken along the −X-axis side.
Figure 3B:
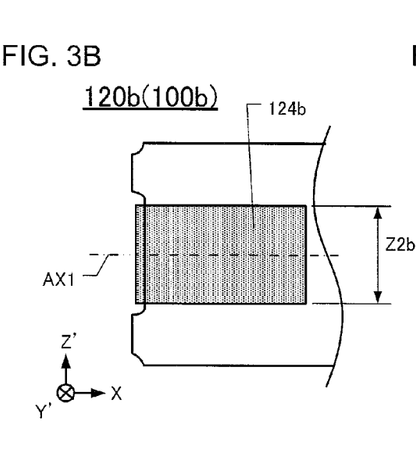
FIG. 3B is a plan view of a half of the bottom surface of an alternative package base 120b of the piezoelectric device 100b taken along the −X-axis side.
Figure 3C:
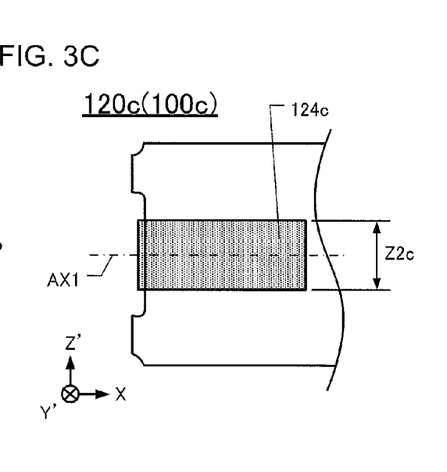
FIG. 3C is a plan view of a half of the bottom surface of an alternative package base 120c of the piezoelectric device 100c taken along the −X-axis side.

FIGS. 3A to 3C show a half of the bottom surface of the package base after the thermo-shock cycle test. Each piezoelectric device used in the thermo-shock cycle test has different maximum width Z2 in the short edge direction of the mounting terminal 124 than the piezoelectric device 100. Aside from the maximum width being different, other components are similar to each other. FIG. 3A is a plan view of a half of the package base 120a of the piezoelectric device 100a taken along the −X-axis side. The maximum width Z2a of the mounting terminal 124a of the package base 120a in the short edge direction is 4.3 mm. FIG. 3B is a plan view of a half of the package base 120b of the piezoelectric device 100b taken along the −X-axis side. The maximum width Z2b of the short edge direction of the mounting terminal 124b situated on the package base 120b is 2.0 mm. FIG. 3C is a plan view of a half of the package base 120c of the piezoelectric device 100c taken along the −X-axis side. The maximum width Z2c of the mounting terminal 124c of the package base 120c in the short edge direction is 1.4 mm.

Figure 3D:
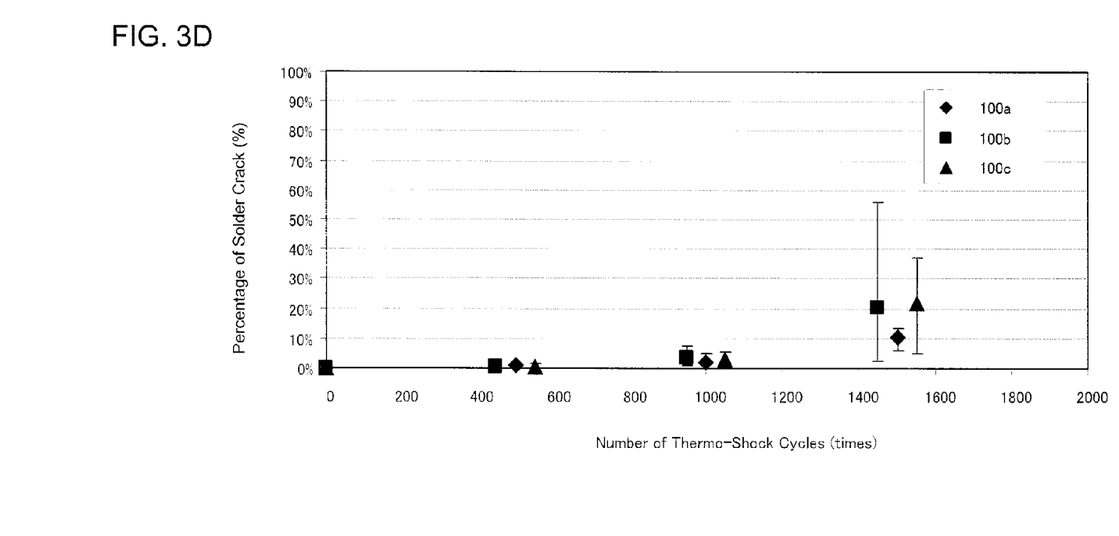
FIG. 3D is a graph showing the result of the thermo-shock cycle test of the piezoelectric devices illustrated in FIGS. 3A-3C.

FIG. 3D is a graph showing the result of the thermo-shock cycle test of the piezoelectric device. The vertical axis indicates the percentage of the solder crack, and the horizontal axis indicates the number of thermo-shock cycle. In the vertical axis indicating the percentage of the solder crack, 100% refers to the condition where the crack fully extends through the X-axis direction of the solder 143. Also, target percentage of the solder crack in condition for use is 85% or lower. The graph shows the percentage of solder crack and its error range of each piezoelectric device at 500-times, 1,000-times and 1,500-times. For the purpose of viewing the result at ease, the result of the thermo-shock cycle test of the piezoelectric device 100b is indicated on the 450-times, 950-times and 1,450-times axes and the result of the piezoelectric device 100c is indicated on the 550-times, 1,050-times and 1,550-times axes respectively, even though each cycles were counted at 500-times, 1,000-times and 1,500-times. Also, the marks on the drawings indicate the average of the solder crack at each thermo-shock cycles.

An average of the percentage of solder crack of the piezoelectric device 100a is 0.8% at 500-times, 2.1% at 1,000-times and 10.3% at 1,500-times. An average of the percentage of solder crack of the piezoelectric device 100b is 0.6% at 500-times, 3.3% at 1,000-times and 20.3% at 1,500-times. An average of the percentage of solder crack of the piezoelectric device 100c is 0.3% at 500-times, 2.8% at 1,000-times and 21.9% at 1,500-times. Also, in the piezoelectric device having long distance X3 between each mounting terminals, the percentage of solder crack reaches nearly 100% when the thermo-shock cycle reaches 1,000-times. Also, the percentage of solder crack permissible as a product is set at 85%.

In the piezoelectric device 100a, an area of the mounting terminal 124a situated on the bottom surface of the package base 120a is formed relatively wide, and thus the percentage of solder crack is relatively low.

In the mounting terminal 124b of the piezoelectric device 100b, the percentage of solder crack is similar to the number that of the piezoelectric device 100a, which indicates low percentage of solder crack. Although the percentage of solder crack increases at the thermo-shock cycle of 1,500-times, the number is still lower than 85%, therefore the percentage of the solder crack is permissible as a product. Similar to the piezoelectric device 100b, in the piezoelectric device 100c, the percentage of solder crack is similar to the number that of the piezoelectric device 100a at 1,000-times, and also indicates low percentage of solder crack at the thermo-shock cycle of 1,500-times.

According to the result shown in FIG. 3D, considering the formation of the mounting terminal, if the distance X3 between the mounting terminals is as narrow as possible, the percentage of the solder crack does not increase in a major way even if width of the mounting terminal in the short edge direction is formed narrow. Also, from the viewpoint of decreasing the usage amount of the electrode materials, the maximum width Z2 of the mounting terminal in the short edge direction is preferred to be less than a half of the width Z1 of the short edge direction of the package base. Here, the amount of usage of the electrode materials is cut down to more than a half than that of forming the maximum width Z2 of the mounting terminal in the short edge direction to the same length as the width Z1 of the package base in the short edge direction. Also, although the distance X3 between each electrode is set at 0.6 mm, the distance X3 falls preferably between 0.5 mm to 1.0 mm. If the distance X3 is shorter than 0.5 mm, the solder bonding each mounting terminal may connect to each other, thus causing electrical short. If the distance X3 is longer than 1.0 mm, the percentage of solder cracks increases.

Second Embodiment

The result from the thermo-shock cycle test in the first embodiment shows that the percentage of solder cracks does not increase significantly even if the maximum width Z2 of the mounting terminal in the short edge direction is relatively narrow. Therefore, amount of the electrode materials can be decreased by forming the maximum width Z1 of the package base in the short edge direction much narrower than the maximum width Z2 of one mounting terminal in the short edge direction. On the other hand, if the maximum width Z2 of the mounting terminal in the short edge direction is formed too narrow, the bonding strength between the piezoelectric device and the printed substrate may become too narrow. Therefore, it is desired to form the maximum width Z2 of the mounting terminal in the short edge direction at a certain size, and mount the piezoelectric device in a stable manner. In the following embodiments, mounting terminals having different profiles are explained, in which the bonding strength between the piezoelectric device and the printed substrate is maintained and the amount of electrode materials is decreased. Also in the following embodiments, the length X1 of the package base in the long edge direction, the width Z1 of the package base in the short edge direction, the maximum length X2 of the bottom surface terminal in the longitudinal direction, the maximum width Z2 of the bottom surface electrode in the short edge direction, and the distance X3 between bottom surface terminals in the longitudinal direction refer to the same reference numerals as the piezoelectric device 100.

In the second embodiment, a package base having first and second edges 127, 128 of different length and having trapezoid profile is explained.

Figure 4A:
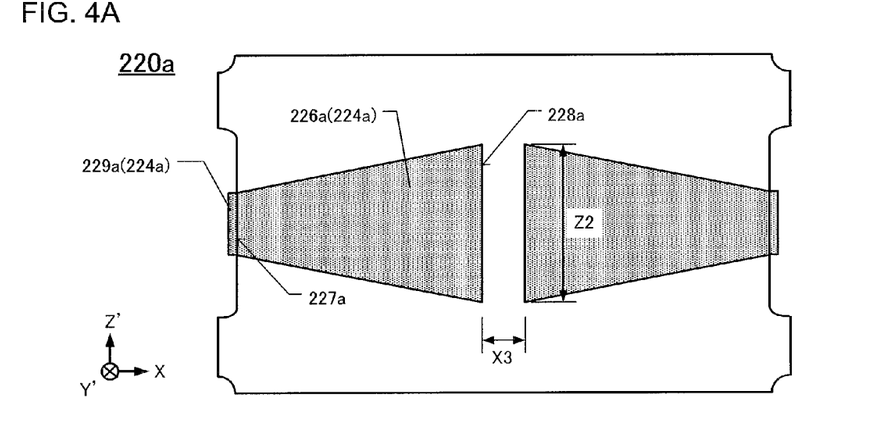

FIG. 4A is a plan view of the package base 220a. The package base 220a comprises a pair of mounting terminals 224a, and each mounting terminal is constituted of a bottom surface terminal 226a and a side surface terminal 229a. The bottom surface terminal 226a is trapezoid-shaped, in which the width of the first edge 227a is less than the width of the second edge 228a. Also, the width of the second edge 228a of the bottom surface terminal 226a is the maximum width Z2 of the bottom surface terminal 226a in the short edge direction. Further, the width of the side surface electrode 229a in the Z'-axis direction is the same width as the first edge 227a. In the package base 220a, an area of the mounting terminal 224a is small, thus reducing the amount of electrode materials. Also, the maximum width Z2 of the bottom surface electrode 226a in the short edge direction provides an area for bonding the solder.

Figure 4B:
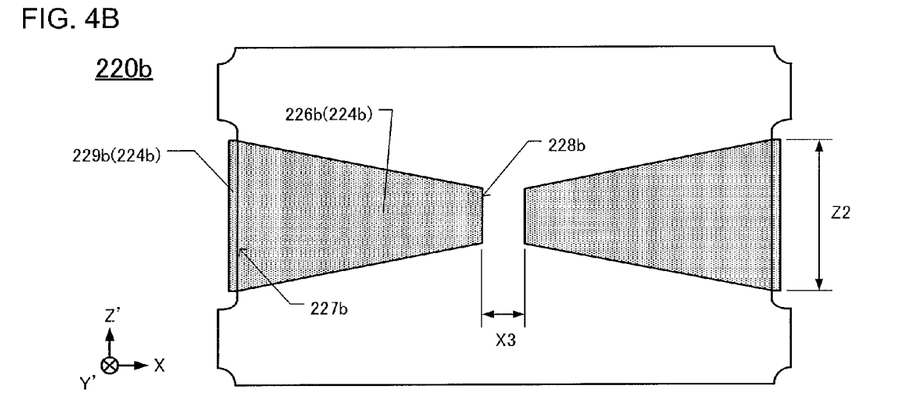
FIG. 4B is a plan view of the bottom surface of an alternative package base 220b.

FIG. 4B is a plan view of the package base 220b. The package base 220b comprises a pair of mounting terminals 224b, and each mounting terminal is constituted of a bottom surface terminal 226b and a side surface terminal 229b. The bottom surface terminal 226b is trapezoid-shaped, in which the width of the first edge 227b is greater than the width of the second edge 228b. Also, the width of the first edge 227b of the bottom surface terminal 226b is the maximum width Z2 of the bottom surface terminal 226b in the short edge direction. Further, the width of the side surface electrode 229a in the Z'-axis direction is the same width as the first edge 227b. In the package base 220b, area of the mounting terminal 224b is small, and thus reduces the amount of electrode materials. Also, area for bonding the solder 143 can be obtained by acquiring the maximum width Z2 of the bottom surface terminal 226b in the short edge direction. Further, the formation of the solder 143 can be easily checked visually by forming the side surface electrode 229b in the Z'-axis direction in a wide manner.

Figure 4C:
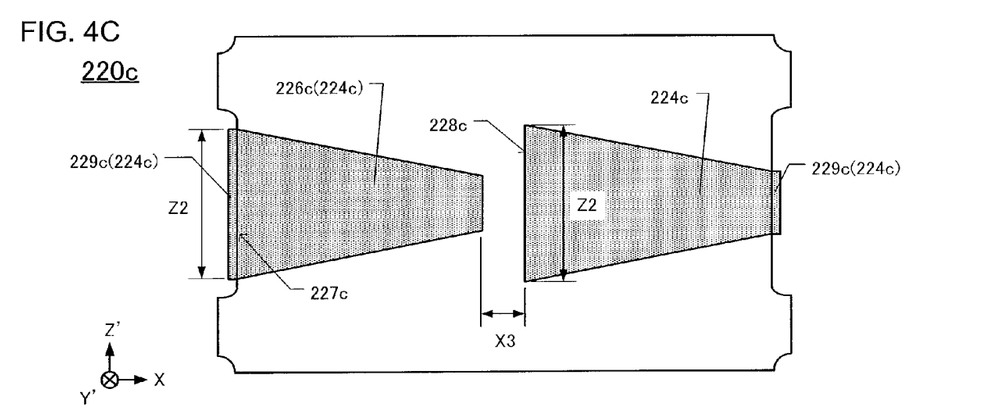
FIG. 4C is a plan view of the bottom surface of an alternative package base 220c.

FIG. 4C is a plan view of the package base 220c. The package base 220c comprises a pair of mounting terminals 224c, and each mounting terminal is constituted of a bottom surface terminal 226c and a side surface terminal 229c. Regarding the pair of mounting terminals 224c, the bottom surface terminal 226c of the −X-axis direction and the bottom surface terminal 226c of the +X-axis direction are formed as an identical shape. Therefore, length of the first edge 227c of the bottom surface terminal 226c in the −X-axis direction and length of the second edge 228c of the bottom surface terminal 226c in the +X-axis direction equals to the maximum width Z2 of the short edge direction. Thus, the −X-axis direction of the package base 220 is bonded stronger than rest of the part of the package base 220c since the maximum width Z2 of each bottom surface terminal 226c is formed on the −X-axis edge. Since the piezoelectric vibrating piece 130 (see FIG. 2A) is bonded to the connecting terminal 123 on the −X-axis side of the package base 220c, the center of the piezoelectric device leans toward the −X-axis direction to a certain degree. Also, the vibration generated in the piezoelectric vibrating piece 130 reaches to the −X-axis edge of the package base 220c through the electrically conductive adhesive 141. In some cases, the package base 220c is preferred to be bonded stronger to the −X-axis side of the printed substrate 160. The package base 220c can be used effective in such case.

Third Embodiment

In the third embodiment, the package bases, comprising mounting terminals including a first rectangular profile and a second rectangular profile, are explained. The first rectangular profile and the second rectangular profile have different widths in the short edge direction, and respective rectangular profiles are combined together to form a mounting terminal as shown in FIGS. 5A-5C.

Figure 5A:
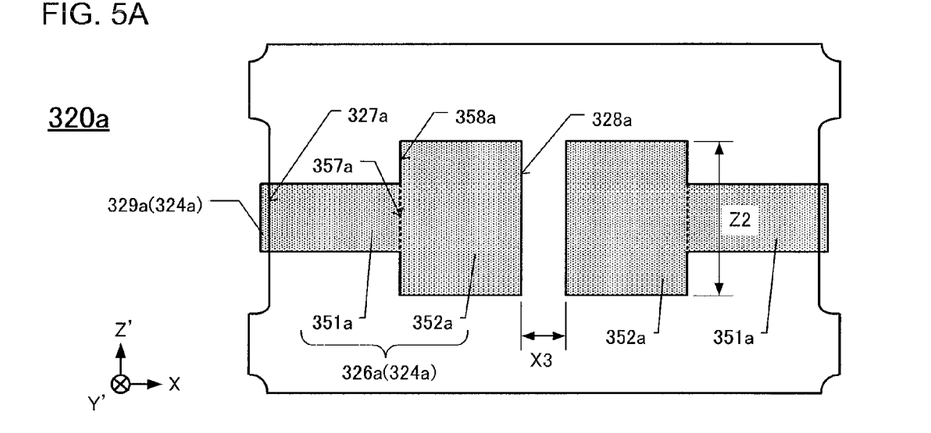

FIG. 5A is a plan view of the package base 320a. The package base 320c comprises a pair of mounting terminals 324a, and each mounting terminal is constituted of a bottom surface terminal 326a and the side surface terminal 329a. The bottom surface terminal 326a of the package base 320a is formed by joining two rectangular profiles. Two rectangular profiles are denoted as a first rectangular profile 351a and a second rectangular profile 352a, respectively. Each bottom surface terminal 326a situated on the package base 320a comprises the respective first edges 327a for forming the first profile 351a and the respective second edges 328a for forming the second profile 352a. Also, when an edge of the first rectangular profile 351a opposing the first edge 327a is denoted as a third edge 357a, and the edge of the second rectangular profile 352a facing the second edge 352a is denoted as a fourth edge 358a, the bottom surface terminal 326a of the mounting terminal 324a and a fourth edge 358a overlap with each other. In the package base 320a, the second edge 328a is formed as the maximum width Z2 in the short edge direction. By forming the width of the first rectangular profile 351a in the short edge direction less than the width of the second rectangular profile, the amount of electrode materials can be reduced, and the area for bonding the solder 143 can be acquired by forming the width of the second rectangular profile 352a in the short edge direction at the maximum width Z2.

Figure 5B:
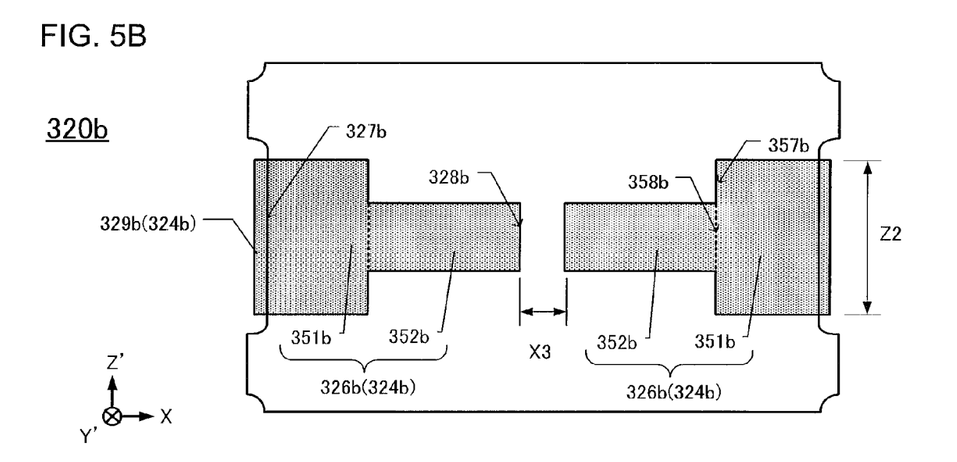
FIG. 5B is a plan view of the bottom surface of an alternative package base 320b.

FIG. 5B is a plan view of the package base 320b. The package base 320b comprises a pair of mounting terminals 324b, and each mounting terminal is constituted of a respective bottom surface terminal 326b and side surface terminal 329b. The bottom surface terminal 326b of each mounting surface terminal 324b situated on the bottom surface of the package base 320b is formed by combining the first rectangular profile 351b and the second rectangular profile 352b. The first rectangular profiles 351b of each bottom surface terminal 326b comprise the first edges 327b, which constitutes one edge of the first rectangular profile 351b and connects to the side surface terminal 329b, and third edges 357b opposing the respective first edges 327b. The second rectangular profiles 352b of each bottom surface terminal 326b comprise the second edges 328b and the fourth edges 358b opposing the respective second edges 328b as their edges. Also, each bottom surface terminal 326b is formed by overlapping of the third edge 357b and the fourth edge 358b. On the package base 320a, the amount of electrode materials can be reduced by forming width of the second rectangular profile 351b narrow, and the area for bonding the solder 143 can be obtained by creating width of the first rectangular profile 351b in the short edge direction as the maximum width Z2. Also, formation of the solder 143 can be visually checked by forming the width of the first edge 327b as the maximum width Z2 and forming the width of the side surface electrode 329b in the Z'-axis direction as Z2.

Figure 5C:
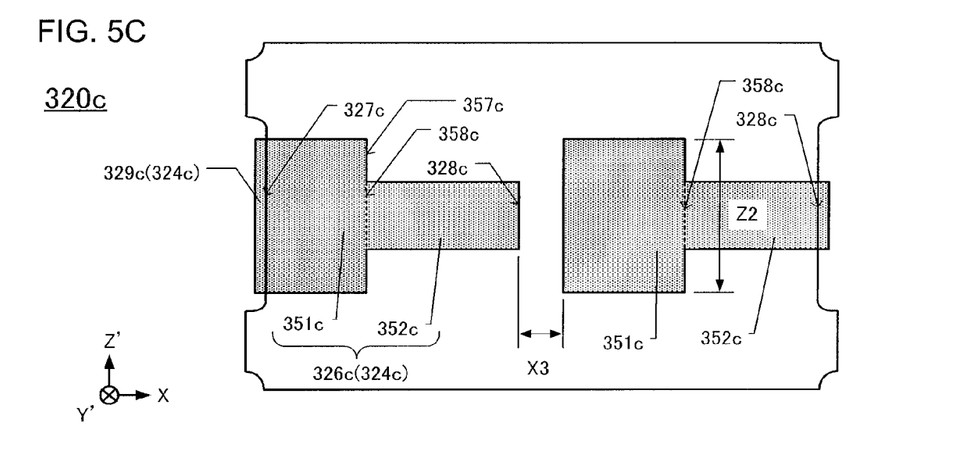
FIG. 5C is a plan view of the bottom surface of an alternative package base 320c.

FIG. 5C is a plan view of the package base 320c. A pair of mounting terminals 324c constituted of respective bottom surface terminal 326c and side surface terminal 329c is formed on the package base 320c.

The bottom surface terminal 326c of each mounting surface terminal 324c formed on the bottom surface of the package base 320c is formed by combining the first rectangular profile 351c and the second rectangular profile 352c. The bottom surface terminal 326c situated on the −X-axis direction comprises a first edge 327c, which constitutes one edge of the first rectangular profile 351c and connects to the side surface terminal 329c situated on the −X-axis direction, and a third edge 357c opposing the first edge 327c. The bottom surface terminal 326c also comprises a second edge 328c, which constitutes one edge of the second rectangular profile 352c, and a fourth edge 358c opposing the second edge 328c. Also, the bottom surface terminal 326c situated on the +X-axis direction comprises a first edge 327c, which constitutes one edge of the second rectangular profile 352c and connects to the side surface terminal 329c on the +X-axis direction, and a third edge 357c opposing the first edge 327c. The bottom surface terminal 326c also comprises a second edge 328c, which constitutes one edge of the first rectangular profile 351c, and a fourth edge 358c opposing the second edge 328c. Also, each bottom surface terminal 326c is formed by overlapping of the third edge 357c and the fourth edge 358c. Thus, the bottom surface terminal 326c situated on the −X-axis direction and the bottom surface terminal 326c situated on the +X-axis direction have similar profiles, the first edge 327c on the bottom surface terminal 326c on the −X-axis direction and the second edge 328c on the bottom surface terminal 326c on the +X-axis direction have same length, and the second edge 328c of the bottom surface terminal 326c on the −X-axis direction and the first edge 327c on the second surface terminal 326c on the +X-axis direction have the same length. On the package base 320c, the bottom surface terminal 326c in the −X-axis direction tends to be bonded stronger, since the maximum width Z2 of each bottom surface terminal 326c in the short edge direction is situated on the −X-axis direction. Thus, the package base 320c can be used effectively whenever the −X-axis direction is preferred to be bonded stronger to the printed substrate 160.

Fourth Embodiment

In the fourth embodiment, the package bases are explained comprising mounting terminals having the maximum width Z2 on different positions than the first edge or the second edge.

Figure 6A:
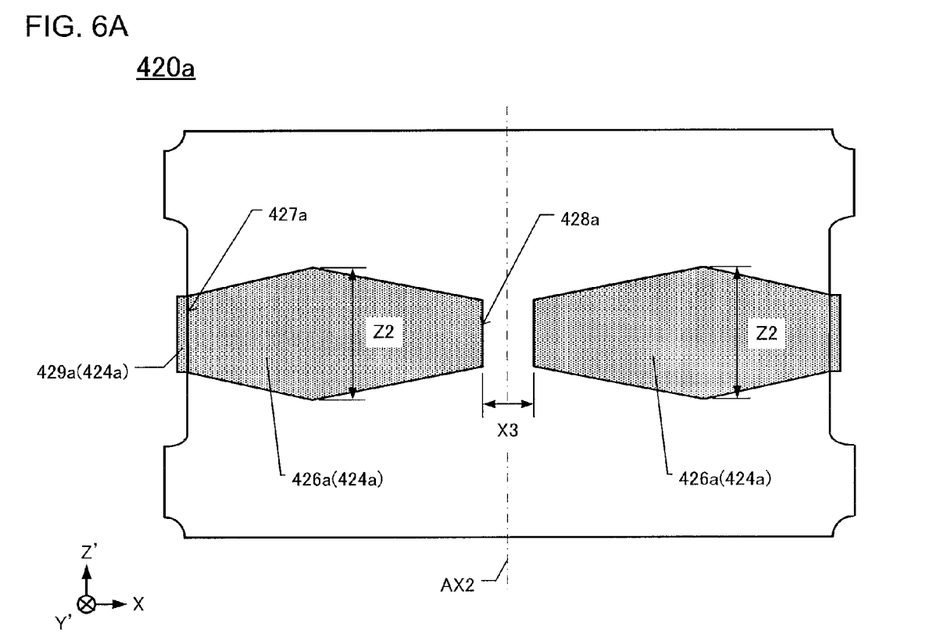

FIG. 6A is a plan view of the package base 420a. On the package base 420a, a pair of mounting terminals 424a is situated, and each mounting terminal 424a is constituted of respective bottom surface terminal 426a and the side surface terminal 429a. The bottom surface terminal 426a of each mounting terminal 424a formed on the bottom surface of the package base 420a comprises a first edge 427a and a second edge 428a. Also, the maximum width Z2 of the bottom surface terminals 426a in the short edge direction is situated at a different position than the first edge 427a or the second edge 428a. On the package base 420a, amount of the electrode materials can be reduced since the area of the mounting terminal 424a is small. Also, the area for soldering can be acquired by obtaining the maximum width Z2 of the bottom surface terminal 426a in the short edge direction. Also, by displacing positions of the maximum width Z2 in the short edge direction toward the −X-axis or +X-axis directions, the position for forming the strongest bonding to the printed substrate 160 of the package base 420a can be adjusted.

Figure 6B:
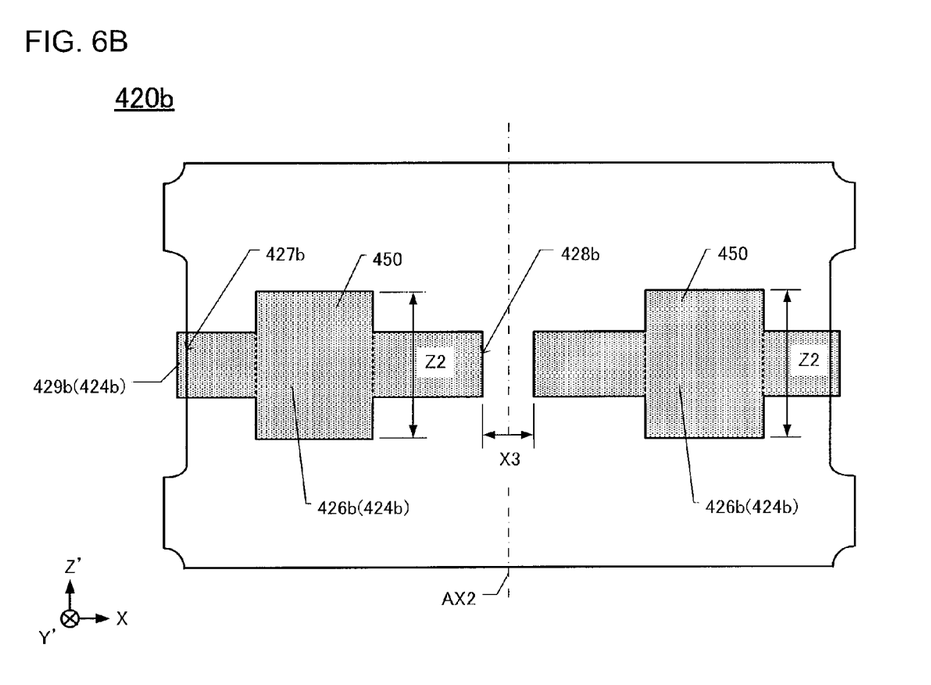
FIG. 6B is a plan view of the bottom surface of an alternative package base 420b.

FIG. 6B is a plan view of the package base 420b. The package base 420b comprises a pair of mounting terminals 424b, and each mounting terminal 424b is constituted of the bottom surface terminal 426b and the side surface terminal 429b. The bottom surface terminal 426b situated on each mounting terminal 424b of the bottom surface of the package base 420b includes the first edge 427b and the second edge 428b. Also, respective rectangular profile regions 450 are formed on the bottom surface terminal 426b, in which the maximum width Z2 is formed at a different position than the first edge 427b or the second edge 428b. On the package base 420b, the amount of electrode materials can be reduced since the area of the mounting terminal 424b is formed small. Also, the area for forming the solder 143 can be acquired by obtaining a rectangular region 450 having the maximum width Z2 of the bottom surface terminal 426b in the short edge direction. Also, by displacing positions of the rectangular region 450 toward the −X-axis or +X-axis directions, the position for forming the strongest bonding to the printed substrate 160 of the package base 420b can be adjusted.

Although length of the first edge and the second edge are shown as same length in the package base 420a and 420b, the length of the first edge or the second edge can be different. Also, although the mounting terminal on the −X-axis and the mounting terminal on the +X-axis are formed symmetrical to the straight line AX2 that passes through the centerline of the package base and is parallel to the short edge, it does not need to be symmetrical as shown in FIG. 4C.

Fifth Embodiment

In the fifth embodiment, the package bases having mounting terminals are explained. The mounting terminals comprise the respective first points, which are situated closest to the other mounting terminal, and the second points and third points are situated on both edges of the mounting terminal at the maximum width in the short edge direction. An outer periphery of the mounting terminals is connected either by respective straight lines or by respective curved lines. Each straight line connects between the first point and the second point, and between the first point and the third point, and each curved line connects the second point and the third point by passing through the first point.

Figure 7A:
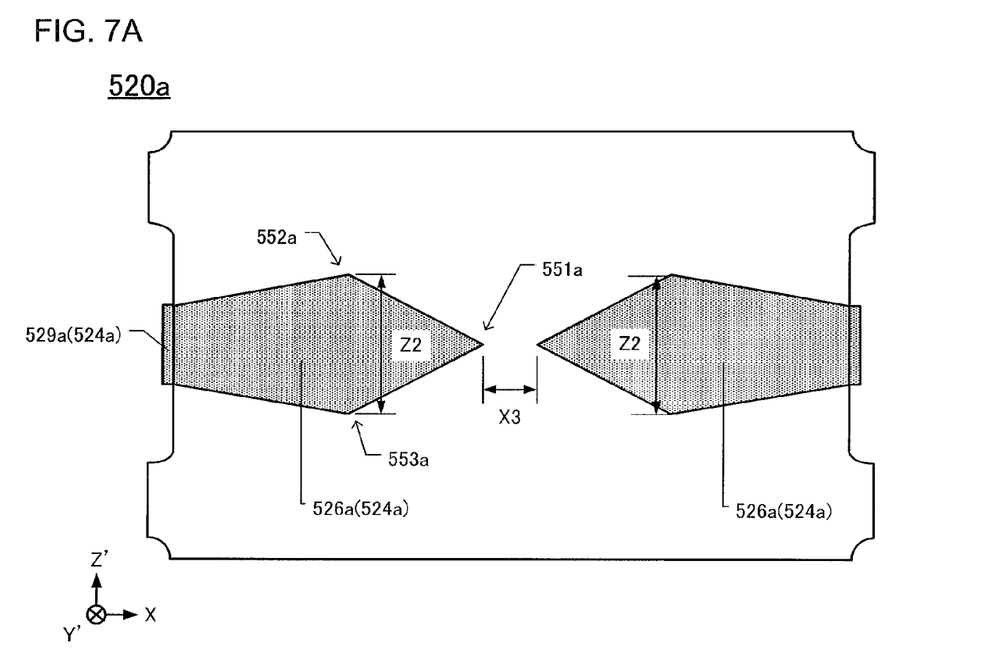

FIG. 7A is a plan view of a package base 520a. The package base 520a comprises a pair of mounting terminals 524a, each mounting terminal 524a is constituted of the bottom surface terminal 526a and the side surface terminal 529a. The bottom surface terminal 526a of each mounting terminal 524a formed on the bottom surface of the package base 520a comprises respective first points 551a situated in a closest position to the other bottom surface terminal 526a, respective second points 552a and respective third points 553a situated on both edge portions of the maximum width Z2 of the bottom surface terminal 526a along the short edge direction. Thus, two first points 551a of each bottom surface terminal 526a are separated by a distance X3. Also an outer periphery of the bottom surface terminal 526a includes the first point 551a that is connected to both second point 552a and third point 553a. Regarding the package base 520a, the amount of electrode materials is reduced although the distance X3 between each bottom surface electrodes 526a and the maximum width Z2 in the short edge direction are maintained.

Figure 7B:
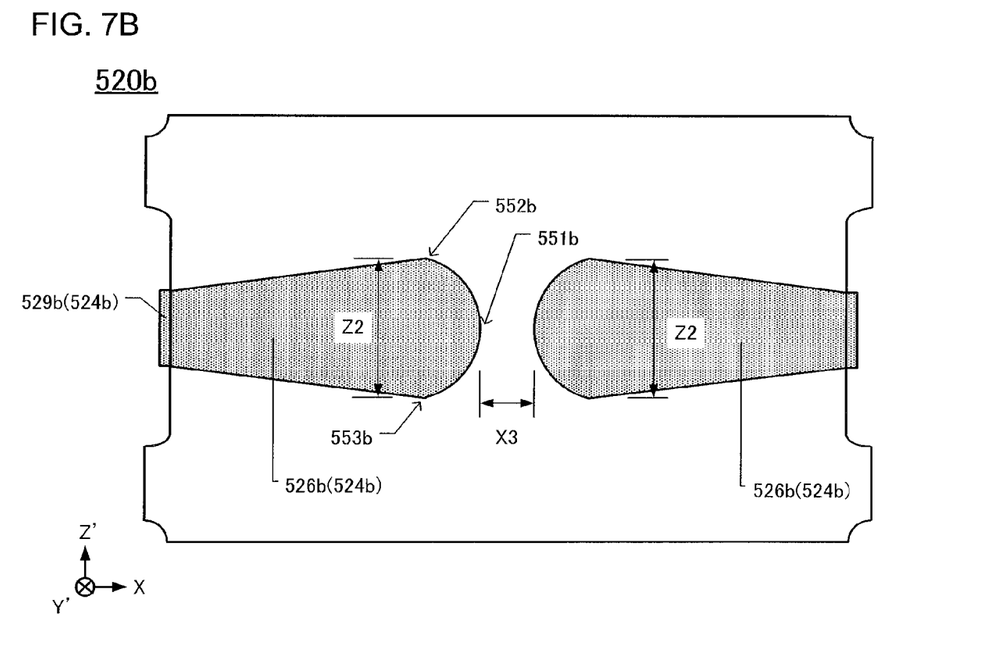
FIG. 7B is a plan view of the bottom surface of an alternative package base 520b.

FIG. 7B is a plan view of the package base 520b. The package base 520b comprises a pair of mounting terminals 524b constituted of the respective bottom surface terminals 526b and the respective side surface terminals 529b. The bottom surface terminals 526b of each mounting terminal 524b situated on the bottom surface of the package base 520b comprises the respective first points 551b situated in a closest position to the other bottom surface terminal 526b, the second points 552b and the third points 553b formed on both edge portions at the maximum width Z2 of the bottom surface terminal 526b along the short edge direction. Thus, two first points 551b of each bottom surface terminals 526b are separated by a distance X3. Also, on the outer periphery of the bottom surface terminal 526b, the second point 552b and the third point 553b are connected by a curved line passing through the first point 551 in arch manner. Regarding the package base 520b, the amount of electrode materials is reduced although the distance X3 between each bottom surface electrodes 526a and the maximum width Z2 in the short edge direction are maintained.

Sixth Embodiment

In the sixth embodiment, a package base including mounting terminals having the maximum width Z2 formed on the first edge and the second edge, and at least one width of the other regions in the short edge direction is formed smaller than the maximum width Z2.

Figure 8A:
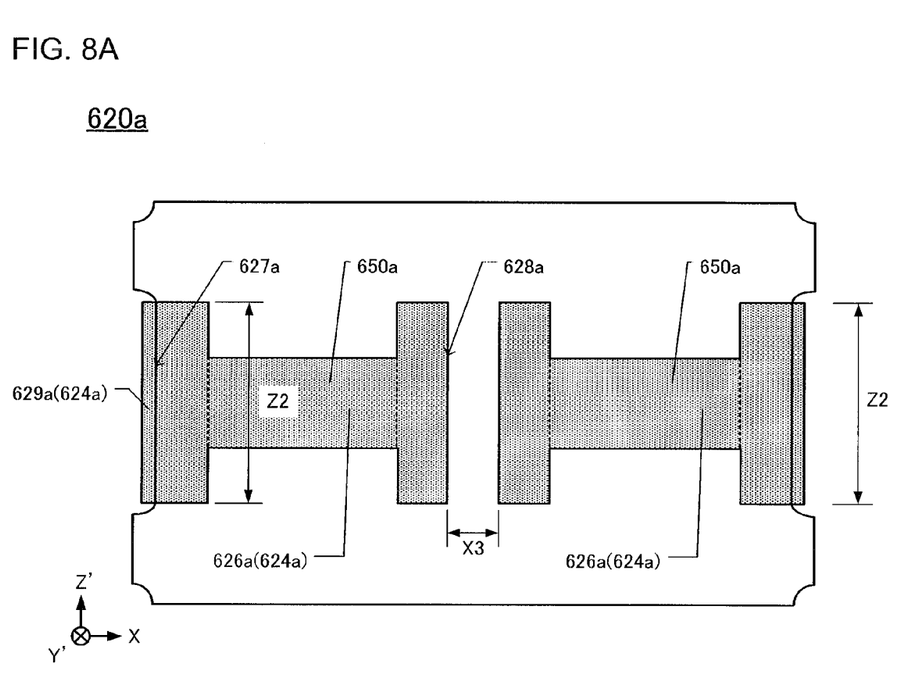

FIG. 8A is a plan view of the package base 620a. The package base 620a comprises a pair of mounting terminals 624a constituted of the respective bottom surface terminals 626a and the respective side surface terminals 629a. Each bottom surface terminal 626a comprises respective first edges 627a and respective second edges 628a, and the width of each edge is the maximum width Z2 in the short edge direction. Also, between respective first edges 627a and second edges 628a, rectangular regions 650a are formed having shorter width in the short edge direction than the maximum width Z2. The bottom surface terminals 626a of the package base 620a have a small area, and thus reduce the amount of electrode materials. Also, by obtaining a large width of the first edge 627a and the second edge 628a where the cracks are likely to occur, the bonding strength of the solder around the first edge 627a and the second edge 628a can be strengthened, and thus increases resistance against cracks.

Figure 8B:
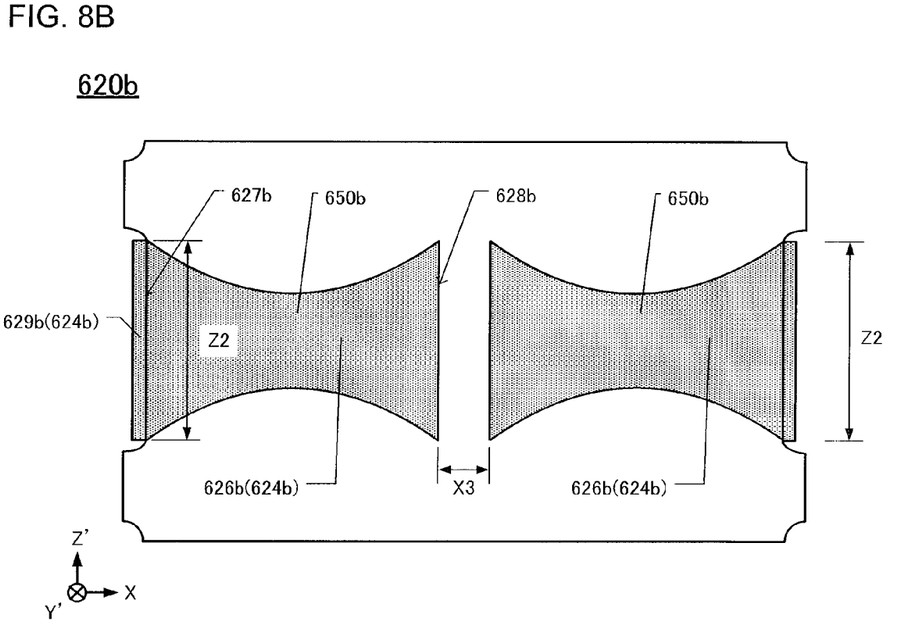
FIG. 8B is a plan view of the bottom surface of an alternative package base 620b.

FIG. 8B is a plan view of the package base 620b. The package base 620b comprises a pair of mounting terminals 624b constituted of the respective bottom surface terminals 626b and the respective side surface terminals 629b. Each bottom surface terminal 626b comprises the respective first edges 627b and the respective second edges 628b, and the width of each edge is the maximum width Z2 of the mounting terminals in the short edge direction. Also, between respective first edges 627b and second edges 628b, rectangular regions 650b are formed having shorter width in the short edge direction than the maximum width Z2. The bottom surface terminals 626b of the package base 620b have small area, and thus reduce the amount of electrode materials. Also, by obtaining a large width of the first edge 627b and the second edge 628b, the bonding strength of the solder around the first edge 627b and the second edge 628b can be strengthened, and thus increases resistance against cracks.

INDUSTRIAL APPLICABILITY

As mentioned above, although optimal embodiments of the present disclosure were explained in detail, it will be understood by a person skilled in the art that the disclosure encompasses various alterations and modifications to the embodiments, within the technical scope of the disclosure.

For example, although embodiments were explained using an AT-cut quartz-crystal material as an example of the piezoelectric vibrating piece, it will be understood that the embodiments can be applied with equal facility to BT-cut piezoelectric material that vibrates in a thickness-shear mode. Also, the embodiments can be applied with equal facility to tuning-fork type quartz-crystal vibrating piece. Further, the piezoelectric vibrating piece can be made with equal facility of other piezoelectric materials such as lithium tantalite, lithium niobate, and piezoelectric materials comprising the piezoelectric ceramics.

Also, although the embodiments were explained based on the piezoelectric device in which the package base and the package lid are stacked together, the embodiments can be applied with equal facility to the piezoelectric vibrating piece stacked together in three-pieces, having a vibrating portion comprising an excitation electrode and a frame portion surrounding the vibrating portion, and is bonded to both principal surfaces of the frame portion of the piezoelectric device.

What is claimed is:

1. A piezoelectric device for mounting onto a printed substrate using solder, said piezoelectric device comprising:
   a piezoelectric vibrating piece having a pair of excitation electrodes; and
   a package base comprising a bottom surface having a pair of parallel long edges having a length, a pair of parallel short edges bisected by a longitudinal centerline, and only a single pair of mounting terminals situated on respective short edges of the bottom surface, the single pair of mounting terminals electrically connected to the pair of excitation electrodes and configured for mounting onto the printed substrate;
   wherein the single pair of mounting terminals are separated by a predetermined longitudinal distance between 6.25% and 12.5% of the length of said long edges, are symmetrical to and bisected by said longitudinal center line and are formed as close as possible in a longitudinal direction, said predetermined longitudinal distance is sufficient to prevent electrical short when mounting the piezoelectric device onto the printed substrate using solder applied to said single pair of mounting terminals, and
   a maximum width of each of said single pair of mounting terminals measured parallel with the short edges of the package base direction is less than one half of the width of the short edge of the package base.

2. The piezoelectric device of claim 1, wherein the predetermined distance is between 0.5 mm and 1.0 mm.

3. The piezoelectric device of claim 2, wherein each of the mounting terminals comprises a first edge, which is the edge of the mounting terminal formed on the short edge of the package base, and a second edge having different length than the first edge and parallel to the first edge;
   wherein the second edges of the mounting terminals are separated by a predetermined longitudinal distance, and the first edge or the second edge are formed in the maximum width of the mounting terminal measured parallel to the short edges of the package base.

4. The piezoelectric device of claim 1, wherein each of the pair of mounting terminals comprises a first edge, which is the edge of the mounting terminal formed on the short edge of the package base, and a second edge having different length than the first edge and is parallel to the first edge;
   wherein the second edges of the mounting terminals are separated by a predetermined longitudinal distance, and the first edge or the second edge are formed in the maximum width of the mounting terminal measured parallel to the short edges of the package base.

5. The piezoelectric device of claim 1, wherein the mounting terminals have trapezoid profile.

6. The piezoelectric device of claim 1, wherein each mounting terminal of the single pair of mounting terminals has a profile comprising first and second rectangular shapes, each of said first and second rectangular shapes having a different width measured parallel to the short edges of the package base, said first rectangular shape extending from a first edge on the short edge of the package base to a third edge longitudinally separated from and parallel to said first edge, said second rectangular shape extending from a second edge longitudinally separated from said third edge to a fourth edge overlapping with said third edge so that said rectangular shapes are in contact with each other.

7. The piezoelectric device of claim 1, wherein each of the mounting terminals comprises a first edge, which is an edge of the mounting terminals formed on the short edge of the package base, and a second edge that is parallel to the first edge;
   wherein the second edges of the mounting terminals are separated by a predetermined longitudinal distance, and both the first edge and the second edge are shorter than the maximum width of the mounting terminals measured parallel to the short edges of the package base.

8. The piezoelectric device of claim 2, wherein each of the mounting terminals comprises a first edge, which is an edge of the mounting terminals formed on the short edge of the package base, and a second edge that is parallel to the first edge;
   wherein the second edges of the mounting terminals are separated by a predetermined longitudinal distance, and both the first edge and the second edge are shorter than the maximum width of the mounting terminals measured parallel to the short edges of the package base.

9. The piezoelectric device of claim 1, wherein each of the mounting terminals comprises a first point, which is a point closest to the other mounting terminal, and a second point and a third point formed on respective edge portions of the mounting terminal at the maximum width of the mounting terminal measured parallel with the short edges of the package base;
   wherein each point is connected by a straight line or curved line, the straight line connects between the first point and the second point, and between the first point and the third point, or a curved line connects the second point and the third point by passing through the first point in arch manner.

10. The piezoelectric device of claim 2, wherein each of the mounting terminals comprises a first point, which is a point closest to the other mounting terminal, and a second point and a third point formed on respective edge portions of the mounting terminal at the maximum width of the mounting terminal measured parallel with the short edges of the package base;
    wherein each point is connected by a straight line or curved line, the straight line connects between the first point and the second point, and between the first point and the third point, or a curved line connects the second point and the third point by passing through the first point in arch manner.

11. The piezoelectric device of claim 1, wherein said predetermined distance is less than approximately 10% of the length of said long edges.

* * * * *